US012353125B2

(12) United States Patent
Satoh et al.

(10) Patent No.: US 12,353,125 B2
(45) Date of Patent: Jul. 8, 2025

(54) PELLICLE (71) Applicant: MITSUI CHEMICALS, INC., Tokyo (JP)

(72) Inventors: Yasushi Satoh, Funabashi (JP); Takashi Unezaki, Ichihara (JP); Hirofumi Tanaka, Tsukuba (JP); Ken Ito, Hiroshima (JP)

(73) Assignee: MITSUI CHEMICALS, INC., Tokyo (JP)

( * ) Notice: Subject to any disclaimer, the term of this patent is extended or adjusted under 35 U.S.C. 154(b) by 633 days.

(21) Appl. No.: 17/442,028

(22) PCT Filed: Mar. 27, 2020

(86) PCT No.: PCT/JP2020/014049
§ 371 (c)(1),
(2) Date: Sep. 22, 2021

(87) PCT Pub. No.: WO2020/196836
PCT Pub. Date: Oct. 1, 2020

(65) Prior Publication Data
US 2022/0171280 A1 Jun. 2, 2022

(30) Foreign Application Priority Data
Mar. 28, 2019 (JP) .................................. 2019-064910

(51) Int. Cl.
*G03F 1/64* (2012.01)
*C09J 11/06* (2006.01)
*C09J 133/08* (2006.01)

(52) U.S. Cl.
CPC ................. *G03F 1/64* (2013.01); *C09J 11/06* (2013.01); *C09J 133/08* (2013.01)

(58) Field of Classification Search
CPC ........................................................ G03F 1/64
See application file for complete search history.

(56) References Cited

U.S. PATENT DOCUMENTS

| | | | | |
|---|---|---|---|---|
| 5,616,927 A | * | 4/1997 | Kubota | G03F 1/64 430/4 |
| 6,013,722 A | | 1/2000 | Yang et al. | |
| 2008/0019078 A1 | * | 1/2008 | Arimitsu | C09J 5/08 361/321.2 |
| 2023/0080753 A1 | * | 3/2023 | Satoh | G03F 7/20 355/30 |

FOREIGN PATENT DOCUMENTS

| | | | | |
|---|---|---|---|---|
| JP | H05281711 A | | 10/1993 | |
| JP | 06148871 A | * | 5/1994 | |
| JP | 07072615 A | * | 3/1995 | |
| JP | 07120931 A | * | 5/1995 | ............... G03F 1/64 |
| JP | 2002501106 A | | 1/2002 | |
| JP | 2009221249 A | * | 10/2009 | |
| JP | 2011128605 A | | 6/2011 | |
| JP | 2013016758 A | * | 1/2013 | ............. H01L 24/97 |
| JP | 2016018008 A | * | 2/2016 | |
| JP | 2017101153 A | * | 6/2017 | |
| KR | 100315961 B1 | * | 4/2002 | |
| KR | 10-2018-0091091 A | | 8/2018 | |
| TW | 201420718 A | | 6/2014 | |
| WO | 2014/046182 A1 | | 3/2014 | |

OTHER PUBLICATIONS

English translation of Notice of Examination Report from Ministry of Economic Affairs Intellectual Property Bureau issued on Jul. 24, 2023, in corresponding Taiwanese Patent Application No. 109110592.

* cited by examiner

Primary Examiner — Martin J Angebranndt
(74) Attorney, Agent, or Firm — BUCHANAN INGERSOLL & ROONEY PC (57) ABSTRACT

Task of the present invention is to provide a tackifier solution having high solution stability and also provide, by using such a tackifier solution, a pellicle having only few tackifier residues and exhibiting reduced outgas generation. Present invention is a pellicle comprising a pellicle frame, a pellicle membrane stretched over an end surface of one opening of the pellicle frame, and a tackifier layer provided on an end surface of the other opening of the pellicle frame, wherein the tackifier layer contains a (meth)acrylic tackifier which is a solidified resin composition comprising a polymer (A) and a radical polymerization initiator (B), the polymer (A) having a structural unit derived from a (meth) acrylate and a side chain consisting of a carbon-carbon multiple bond-containing group.

6 Claims, 1 Drawing Sheet

PELLICLE

TECHNICAL FIELD

The present invention relates to a pellicle used for protecting a lithography mask from dust in the lithography process for semiconductor devices, such as LSIs and VLSIs, liquid crystal display panels, and the like.

BACKGROUND ART

In the lithography process for semiconductor devices, such as LSIs and VLSIs, liquid crystal display panels, and the like, a pellicle is mounted on a lithography mask for preventing possible attachments of foreign substances to the mask. The pellicle generally includes: a pellicle frame; a transparent pellicle membrane stretched over the upper end surface of the pellicle frame; a tackifier layer provided on the lower end surface of the pellicle frame for sticking the pellicle to the mask. In general, a single pellicle is used repeatedly and the tackifier layer is for attaching the pellicle to the mask in a peelable manner. Accordingly, the tackifier layer of the pellicle is required to simultaneously achieve a high load bearing and suppression of tackifier residues after peeling-off of the pellicle.

Known tackifiers used for the tackifier layer of the pellicle include rubber tackifiers and polyurethane tackifiers, a silicone tackifier described in PTL 1, and an acrylic tackifier described in PTL 2.

In recent years, reduction in the wavelength of exposure light has advanced with the miniaturization of mask patterns. Examples of short-wavelength light include excimer light, such as KrF excimer laser and ArF excimer laser. Such short-wavelength light have high energy and, therefore, tackifier components are likely to decompose during light exposure. The decomposition of the tackifier components have been recognized to cause generation of organic gas components (known as outgas). The outgas is also known as a cause of a stain (also called "haze") of the pellicle membrane.

For example, the pellicle of PTL 2 uses a (meth)acrylic tackifier containing reaction product of a (meth)acrylate alkyl ester copolymer and a curing agent and having an ability to adsorb organic gas. In this pellicle, generation of outgas is suppressed by the adsorption of organic gas using the (meth)acrylic tackifier, thereby suppressing the occurrence of haze in the pellicle.

CITATION LIST

Patent Literature

PTL 1
  Japanese Patent Application Laid-Open No. H05-281711
PTL 2
  Japanese Patent Application Laid-Open No. 2011-128605

SUMMARY OF INVENTION

Technical Problem

The silicone tackifier described in PTL 1 has been reported to generate a large amount of outgas and, therefore, this tackifier suffers a problem, such that a large amount of haze occurs during a lithography process which uses a short wavelength exposure light.

The (meth)acrylic tackifier described in PTL 2 uses an epoxy or isocyanate compound as a crosslinking agent. Since the epoxy or isocyanate compound per se is a highly reactive compound, there is a concern about the stability of the resin composition which is the reaction mixture.

Task of the present invention is to provide a resin composition having high solution stability by using specific polymer (A) in combination with radical polymerization initiator (B), and also provide, by using such a resin composition, a pellicle having only few tackifier residues and exhibiting suppressed outgas generation.

Solution to Problem

As a result of an intensive study for solving the above-mentioned problem, the present inventors have found that a solution of a (meth)acrylic tackifier which comprises polymer (A) having a structural unit derived from a (meth) acrylate and a side chain consisting of a carbon-carbon multiple bond-containing group in combination with radical polymerization initiator (B) has high solution stability. This is considered to be the result of increased stability of a reaction mixture which is achieved by using, as a main ingredient, a compound having multiple bonds. The present invention has been completed based on these findings.

Accordingly, the present invention relates to the following pellicle.

[1] A pellicle comprising: a pellicle frame; a pellicle membrane stretched over an end surface of one opening of the pellicle frame; and a tackifier layer provided on an end surface of the other opening of the pellicle frame, in which the tackifier layer contains a (meth)acrylic tackifier which is a solidified resin composition comprising polymer (A) and radical polymerization initiator (B), the polymer (A) having a structural unit derived from a (meth)acrylate and a side chain consisting of a carbon-carbon multiple bond-containing group.

[2] The pellicle according to [1], in which a multiple bond equivalent of the polymer (A) is 156 g/mol or more and 100,000 g/mol or less.

[3] The pellicle according to [1] or [2], in which the carbon-carbon multiple bond-containing group is a carbon-carbon double bond-containing group.

[4] The pellicle according to any one of [1] to [3], in which a weight average molecular weight of the polymer (A) is 10,000 or more and 1,000,000 or less.

[5] The pellicle according to any one of [1] to [4], in which the radical polymerization initiator (B) is a thermal radical polymerization initiator.

[6] The pellicle according to [5], in which the radical polymerization initiator (B) is a peroxide radical polymerization initiator or an azotype radical polymerization initiator.

[7] The pellicle according to any one of [1] to [6], in which the resin composition further comprises a crosslinking agent (C).

[8] The pellicle according to [7], in which the crosslinking agent (C) is a compound having a multifunctional carbon-carbon multiple bond.

Advantageous Effects of Invention

According to the present invention, a tackifier solution having high solution stability is obtained by using a specific polymer (A) in combination with radical polymerization initiator (B). By using such a tackifier solution, the present invention is capable of providing a pellicle having only few tackifier residues and exhibiting suppressed outgas generation.

DESCRIPTION OF EMBODIMENTS

1. Pellicle

Pellicle of the present invention comprises a pellicle frame; a pellicle membrane stretched over an end surface of one opening of the pellicle frame; and a tackifier layer provided on an end surface of the other opening of the pellicle frame.

1-1. Pellicle Frame

The pellicle frame may be any commonly-used pellicle frame. Examples of the materials for the pellicle frame include an aluminum alloy, a stainless steel, a polyethylene, and a black anodized aluminum. Among such materials, the aluminum alloy, the black anodized aluminum and the like are preferred because of their properties, such as light weight.

1-2. Pellicle Membrane

The pellicle membrane is fixed to one opening of the pellicle frame. The pellicle membrane may be any pellicle membrane generally used in the art. Examples of the materials for the pellicle membrane include nitrocellulose, ethyl cellulose, cellulose acetate, cellulose propionate, pullulan compounds, amorphous fluorine polymers, and silicone-modified polyvinyl alcohols. Among such materials, preferred are amorphous fluorine polymers having satisfactory resistance to excimer light.

1-3. Tackifier Layer

The tackifier layer contains a (meth)acrylic tackifier which is a solidified resin composition comprising polymer (A) and radical polymerization initiator (B).

Polymer (A)

Polymer (A) is a polymer having a structural unit derived from a (meth)acrylate (hereinafter, may be referred to as "structural unit (I)") and a side chain consisting of a carbon-carbon multiple bond-containing group. In addition to the structural unit (I), polymer (A) preferably contains a structural unit comprising a hydroxyl group (hereinafter, may be referred to as "structural unit (II)"). Polymer (A) may also contain structure units other than the structural units (I) and (II).

Polymer (A) also comprises a side chain consisting of a carbon-carbon multiple bond-containing group. The carbon-carbon multiple bond-containing group may be contained in the structural unit (II) or other structural units. The carbon-carbon multiple bond-containing group and each of the structural units are explained below.

Carbon-Carbon Multiple Bond-Containing Group

There is no particular limitation on the carbon-carbon multiple bond-containing group as long as the group contains a carbon-carbon double bond and/or a carbon-carbon triple bond. A polymerizable carbon-carbon multiple bond means an ethylenic or alkynic carbon-carbon multiple bond.

There is no particular limitation on the carbon-carbon double bond-containing group as long as the group contains a carbon-carbon double bond. Examples include polyethylene glycol #600 diacrylate, isoprene, diallyl ether, and divinylbenzene (such as (meth)acryloyl group, vinyl group, allyl group, styryl group). Further, there is no particular limitation on the carbon-carbon triple bond-containing group as long as the group contains a carbon-carbon triple bond. Examples include hexane-1,5-diyne, diethynylbenzene and diethylene glycol bis(2-propynyl) ether. Among such examples, a (meth)acrylic group, which is the carbon-carbon double bond-containing group, is preferred from the viewpoint of excellent stability and reactivity of its radical and satisfactorily large decrease in tackiness after heating.

The expression "(meth)acryl" used in the present specification encompasses either one or both of "acryl" and "methacryl"; and the expression "(meth)acryloyl" also has a similar meaning.

Polymer (A) may have a multiple bond-containing group in either the side chain or the terminus, but the side chain is preferred from the viewpoint of improving the reactivity of the polymeric carbon-carbon multiple bond and satisfactorily enlarging the decrease in tackiness after heating or UV curing.

Polymer (A) having the multiple bond-containing group in its side chain may be obtained by a method which comprises: providing a precursor polymer having, for example, a hydroxyl group or carboxyl group in its side chain, and reacting the hydroxyl group or carboxyl group with an isocyanate compound or epoxy compound having a multiple bond.

The range of a multiple bond equivalent, which represents the content of the multiple bond-containing group of the polymer (A) is preferably 156 g/mol or more and 100,000 g/mol or less, more preferably 500 g/mol or more and 50,000 g/mol or less, still more preferably 1,000 g/mol or more and 20,000 g/mol or less. When the content of the multiple bond-containing group is within the above-mentioned range, not only design of tackiness (ranging from weak tackiness to strong tackiness) after curing by heat or UV radiation, but also satisfactory reduction of tackifier residues becomes possible.

The multiple bond equivalent may be represented by the following formula which is a mass (g) of solid contents of polymer (A), relative to the total number of moles (mol) of the multiple bonds (i.e., double bond(s) and triple bond(s)) in the polymer (A).

Multiple bond equivalent (g/mol)=Mass (g) of solid contents of polymer (A)/number of moles of multiple bonds in polymer (A)

Herein, the mass of solid contents of the polymer (A) is a weight average molecular weight (Mw) of the polymer (A). Further, the number of moles of multiple bonds in the polymer (A) is the number of moles of the compounds having the polymeric multiple bonds in the side chain.

The weight average molecular weight (Mw) of the polymer (A) is a polystyrene conversion weight average molecular weight measured by gel permeation chromatography (GPC). Details of the measuring method will be explained below.

The number of moles of the multiple bonds in the polymer (A) may be calculated from integrated value of a $^1$H-NMR spectrum. For example, a sample solution is prepared by adding an arbitrary amount (e.g., 0.1 mmol) of a standard reagent (such as styrene) to the polymer (A), thereby preparing a solution, and diluting the thus prepared solution with a deuterated solvent (e.g., $CDCl_3$). A spectrum is obtained by measuring the $^1$H-NMR of the prepared sample solution. Number of moles of the multiple bonds may be obtained from an integral value of a peek ascribed to the standard reagent and an integral value of a peek ascribed to the multiple bonds.

Structural Unit (I)

Structural unit (I) is a structural unit derived from (meth) acrylate. The structural unit (I) has a structure represented by the formula $—CH_2—CH(COOCH_3)—$.

In addition, the structural unit (I) is a structural unit derived from an alkyl ester of a (meth)acrylic acid having a $C_4$ to $C_{10}$ alkyl group. Examples of $C_4$ to $C_{10}$ alkyl groups include n-butyl group, n-pentyl group, n-hexyl group, n-octyl group, 2-ethylhexyl group, and n-decyl group. Among such groups, n-butyl group and 2-ethylhexyl group are preferred.

Further, the structural unit (I) is preferably a structure in which a detachment derived from the structural unit (I) becomes a compound having a boiling point of 150° C. or less. For example, when the structural unit (I) is butyl acrylate, detachment is butanol having a boiling point of 117° C. When the boiling point of the detachment is 150° C. or less, removal of outgas becomes easy. Examples of structural unit (I) which generate detachments having a boiling point of 150° C. or less include methyl (meth) acrylate, ethyl (meth)acrylate, propyl (meth)acrylate, isopropyl (meth)acrylate, and vinyl acetate which are (meth) acrylates having an ester group with 5 or less carbons.

When the polymer (A) has the structural unit (I), minimum of the structural unit (I) content is preferably 5 mass %, more preferably 10 mass %, still more preferably 30 mass %, and most preferably 40 mass %. Maximum of the structural unit (I) content is preferably 95 mass %, more preferably 80 mass %, still more preferably 70 mass %, most preferably 60 mass %. When the content of the structural unit (I) is in the above-mentioned range, strength of the tackifier layer becomes increased and, as a result, tackiness increases even further. In addition, when the content of the structural unit (I) is in the above-mentioned range, not only design of tackiness ranging from weak tackiness to strong tackiness, but also satisfactory reduction of tackifier residues become possible.

Structural Unit (II)

Structural unit (II) is a structural unit containing a hydroxyl group. Tackiness of the polymer (A) becomes improved by the presence of the structural unit (II).

Examples of the hydroxyl groups include alcoholic hydroxyl groups. Alcoholic hydroxyl groups are preferred from the viewpoint of lowering the tackifier residues.

Examples of monomers which provide the structural unit (II) include hydroxyalkyl (meth)acrylates, such as hydroxyethyl (meth)acrylate, hydroxypropyl (meth)acrylate, and hydroxybutyl (meth)acrylate; hydroxyaryl (meth)acrylates, such as hydroxyphenyl (meth)acrylate, and hydroxynaphthyl (meth)acrylate. Among these, preferred are hydroxyalkyl (meth)acrylates, more preferred are hydroxyalkyl acrylates, and still more preferred are hydroxyethyl acrylates.

When the polymer (A) has the structural unit (II), minimum of the structural unit (II) content is preferably 1 mass %, more preferably 3 mass %, still more preferably 4 mass %, and most preferably 5 mass %. Maximum of the structural unit (II) content is preferably 30 mass %, more preferably 25 mass %, still more preferably 15 mass %, and most preferably 10 mass %.

Weight average molecular weight of the polymer (A) is preferably in the range of from 10,000 or more and 1,000,000 or less, more preferably in the range of from 30,000 or more and 100,000 or less. When the weight average molecular weight is in the above-mentioned range, both cohesiveness and adhesiveness of the tackifier layer falls within appropriate ranges and tackifier residues are unlikely to occur.

Herein, the weight-average molecular weight (Mw) is a weight-average molecular weight based on polystyrene, as measured by gel permeation chromatography (GPC).

Molecular weight distribution (Mw/Mn) of the polymer (A) is the ratio of the Mw to the number-average molecular weight (Mn) based on polystyrene, as measured by GPC, and minimum value thereof is usually 1, and preferably 1.1. Maximum value of the Mw/Mn is preferably 5, more preferably 3, still more preferably 2, and most preferably 1.7. The molecular weight distribution in the above-mentioned range enables control of crosslinking degree, and improves the control of functional groups adversely affecting the tackifier residue, thereby reducing the occurrence of tackifier residues.

In the present specification, Mw and Mn of the polymer (A) are measured by GPC under the following conditions.

GPC Columns: for example, "TSKgel Multipore HXL-M"×2 (manufactured and sold by TOSOH CORPORATION)
Column temperature: 40° C.
Elution solvent: tetrahydrofuran (manufactured and sold by Wako Pure Chemical Industries, Ltd.)
Flow rate: 1.0 mL/min
Sample concentration: 0.05 mass
Amount of sample injection: 100 μL
Detector: infrared spectrometer
Standard substances: monodispersed polystyrene Radical Polymerization Initiator (B)

There is no particular limitation with respect to the type of radical polymerization initiator (B) used in the tackifier, and a photoradical polymerization initiator and thermal radical polymerization initiator may be used.

A photoradical polymerization initiator is a compound which generates a radical by light radiation, that is, a compound which absorbs light energy and decomposes to generate radical species. A thermal radical polymerization initiator is a compound which generates a radical by heating, that is, a compound which absorbs heat energy and decomposes to generate radical species. As the radical polymerization initiator (B), either one of the photoradical polymerization initiator and thermal radical polymerization initiator may be used, or a combination of several types of the radical polymerization initiators may be used. Since pellicles are used under light radiation, for preventing a change in physical properties or other features of the tackifier by the reaction of residual photoradical polymerization initiator in the tackifier by light under operating environment, the thermal radical polymerization initiator is preferred over the photoradical polymerization initiator.

As the thermal radical polymerization initiator (B), a peroxide type radical polymerization initiator or azotype radical polymerization initiator is preferred.

Specific examples of the peroxide type radical polymerization initiators include the following compounds and commercially available products: di-isobutyl peroxide, cumyl peroxyneodecanoate, di-n-propyl peroxydicarbonate, di-isopropylperoxydicarbonate, di-sec-butyl peroxydicarbonate, 1,1,3,3-tetramethylbutyl peroxyneodecanoate, di(4-t-butylcyclohexyl) peroxydicarbonate, di(2-ethylhexyl) peroxydicarbonate, t-hexyl peroxyneodecanoate, t-butyl peroxyneodecanoate, t-butyl peroxyneoheptanoate, t-hexyl peroxypivalate, t-butyl peroxypivalate, di(3,5,5-trimethylhexanoyl) peroxide, dilauroyl peroxide, 1,1,3,3-tetramethylbutyl peroxy-2-ethylhexanoate, disuccinic acid peroxide, 2,5-dimethyl-2,5-di(2-ethylhexanoylperoxy)hexane, t-hexylperoxy-2-ethylhexanoate, di(4-methylbenzoyl)peroxide, t-butylperoxy-2-ethylhexanoate, di(3-methylbenzoyl)peroxide, benzoyl(3-methylbenzoyl)peroxide, dibenzoyl peroxide, dibenzoyl peroxide, 1,1-di(t-butylperoxy)-2-methylcyclohexane, 1,1-di(t-hexylperoxy)-3,3,5-trim ethyl cyclohexane, 1,1-di(t-hexylperoxy)cyclohexane, 1,1-di(t-butylperoxy)cyclohexane, 2,2-di[4,4-di-(t-butylperoxy)cyclohexyl]propane, t-hexylperoxyisopropylmonocarbonate, t-butylperoxy maleate, t-butylperoxy-3,5,5-trimethylhexanoate, t-butylperoxylaurate, t-butylperoxy isopropyl monocarbonate, t-butylperoxy-2-ethylhexyl monocarbonate, t-hexylperoxy benzoate, 2,5-dimethyl-2,5-di(benzoylperoxy)hexane, t-butylperoxyacetate, 2,2-di(t-butylperoxy) butane, t-butylperoxybenzoate, n-butyl-4,4-di-t-butylperoxyvalelate, di(2-t-butylperoxy isopropyl)benzene, dicumyl peroxide, di-t-hexyl peroxide, 2,5-dimethyl-2,5-di(t-butylperoxy)hexane, t-butylcumyl peroxide, di-t-butylperoxide, p-menthane hydroperoxide, 2,5-dimethyl-2,5-di(t-butylperoxy)hex-3-yne, diisopropylbenzene hydroperoxide, 1,1,3,3-tetramethylbutyl hydroperoxide, cumene hydroperoxide, t-butyl hydroperoxide, 2,4-dichlorobenzoyl peroxide, o-chlorobenzoyl peroxide, p-chlorobenzoyl peroxide, tris(t-butylperoxy)triazine, 2,4,4-trimethylpentyl peroxyneodecanoate, α-cumyl peroxyneodecanoate, t-amylperoxy 2-ethylhexanoate, t-butyl peroxyisobutylate, di-t-butyl peroxyhexahydroterephthalate, di-t-butyl peroxytrimethyladipate, di-3-methoxybutyl peroxydicarbonate, diisopropyl peroxydicarbonate, t-butyl peroxyisopropylcarbonate, 1,6-bis(t-butylperoxycarbonyloxy)hexane, diethyleneglycol bis (t-butylperoxycarbonate), t-hexyl peroxyneodecanoate.

Other examples include ketone peroxides, such as PERHEXAH; peroxyketals, such as PERHEXA TMH; hydroperoxides, such as PERBUTYL H-69; dialkyl peroxides, such as PERCUMYL D, PERBUTYL C, PERBUTYL D, PERBUTYL O; diacyl peroxides, such as NYPER BW; peroxyesters, such as PERBUTYL Z, PERBUTYL L; peroxydicarbonates, such as PEROYL TCP, all sold by NOF Corporation.

Other examples include TRIGONOX 36-C75, LAUROX, PERKADOX L-W75, PERKADOX CH-50L, TRIGONOX TMBH, KAYACUMEN H, KAYABUTYL H-70, PERKADOX BC-FF, KAYAHEXAAD, PERKADOX 14, KAYABUTYL C, KAYABUTYL D, PERKADOX 12-XL25, TRIGONOX 22-N70 (22-70E), TRIGONOX D-T50, TRIGONOX 423-C70, KAYAESTER CND-C70, TRIGONOX 23-C70, TRIGONOX 257-C70, KAYAESTER P-70, KAYAESTER TMPO-70, TRIGONOX 121, KAYAESTER O, KAYAESTER HTP-65W, KAYAESTER AN, TRIGONOX 42, TRIGONOX F-C50, KAYABUTYL B, KAYACARBON EH, KAYACARBON I-20, KAYACARBON BIC-75, TRIGONOX 117, KAYALENE 6-70, all manufactured and sold by KAYAKU AKZO CORPORATION.

The above-mentioned peroxide type radical polymerization initiators may be used alone or in combination of several compounds.

Examples of the azotype radical polymerization initiators include compounds having an azo group, such as azonitrile compounds, azoester compounds, azoamide compounds, azoamidine compounds, azoimidazoline compounds, and polymeric azotype compounds.

Examples of azonitrile compounds include 2,2'-azobis (isobutyronitrile), 2,2'-azobis-2-methylisobutyronitrile, 1,1'-azobis(cyclohexane-1-carbonitrile), 1-[(1-cyano-1-methylethyl)azo]formamide, 2,2'-azobis(4-methoxy-2,4-dimethylvaleronitrile), 2,2'-azobis(2,4-dimethylvaleronitrile), 2,2'-azobis(2-methylbutyronitrile), and 4,4'-azobis(4-cyanovaleric acid).

Examples of azoester compounds include dimethyl 2,2'-azobis(2-methylpropionate), dimethyl 1,1'-azobis(1-cyclohexanecarboxylate), and 1,1'-azobis-(1-acetoxy-1-phenylethane).

Examples of azoamide compounds include 2,2'-azobis[N-(2-propenyl)-2-methylpropionamide], 2,2'-azobis(N-butyl-2-methylpropionamide), 2,2'-azobis(N-cyclohexyl-2-methylpropionamide), 2,2'-azobis{2-methyl-N-[1,1-bis(hydroxymethyl)-2-hydroxyethyl]propionamide}, and 2,2'-azobis[2-methyl-N-(2-hydroxyethyl)propionamide].

Examples of azoamidine compounds include 2,2'-azobis (2-methylpropionamidine) dihydrochloride, 2,2'-azobis(N-(2-carboxyethyl)-2-methylpropionamidine) tetrahydrate, 2,2'-azobis(2-amidinopropane) dihydrochloride, and 2,2'-azobis(1-imino-1-pyrrolizino-2-methylpropane) dihydrochloride.

Examples of azoimidazoline compounds include 2,2'-azobis[2-[1-(2-hydroxyethyl)-2-imidazolin-2-yl]propane] dihydrochloride, 2,2'-azobis[2-(2-imidazolin-2-yl)propane] dihydrochloride, 2,2-azobis[2-(2-imidazolin-2-yl)propane] dihydrochloride, and 2,2-azobis[2-(2-imidazolin-2-yl)propane] di sulfate dihydrate.

Examples of high molecular weight azotype compounds include compounds of trade names VPE-0201, VPE-0401, VPE-0601, and VPS-1001 (each manufactured and sold by Wako Pure Chemical Corporation).

The above-mentioned azotype radical polymerization initiators may be used alone or in combination of several compounds.

Ten (10)-hour half-life temperature of the radical polymerization initiator (B) is preferably 50° C. to 150° C., more preferably 60° C. to 140° C., and still more preferably 70° C. to 130° C. The 10-hour half-life temperature in the above-mentioned range reduces the occurrence improper curing and this results in suppression of tackifier residues.

The 10-hour half-life temperature value of the radical polymerization initiator (B) may be obtained from literatures, such as a product catalogue of a manufacturer. For example, reference may be made to the catalogue value of the NOF Corporation (http://www.nof.co.jp/upload_public/sogo/B0100.pdf).

There is no particular limitation with respect to the photoradical polymerization initiator (B) used in the present invention as long as the photoradical polymerization initiator shows light absorbance to light source used for photocuring. Examples include 2,2-dimethoxy-1,2-diphenyl ethan-1-one, 1-hydroxy-cyclohexyl-phenyl-ketone, 1-[4-(2-hydroxyethoxy)-phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)-1-buthanone, bis(2,4,6-trimethylbenzoyl)-phenylphosphine oxide, 2-hydroxy-1-{4-

[4-(2-hydroxy-2-methyl-propionyl)-benzyl]-phenyl}-2-methyl-propane, 1,2-octanedion 1-[4-(phenylthio)-2-(O-benzoyloxime)], 2-hydroxy-2-methyl-1-phenyl-propane-1-one, phenylglyoxylic acid methyl ester, and 2,4,6-trimethylbenzoyl-diphenyl-phosphine oxide.

The above-mentioned compounds may be obtained as commercial products, such as OMNIRAD 1000, 248, OMNIRAD 481, OMNIRAD 4817, OMNIRAD 4MBZ-flakes, OMNIRAD 500, OMNIRAD 659, OMNIRAD 73, OMNIRAD 784, OMNIRAD 81, OMNIRAD BDK, OMNIRAD MBS, OMNIRAD BP-flakes, OMNIRAD DETX, OMNIRAD EDB, OMNIRAD EHA, OMNIRAD EMK, OMNIRAD ITX, OMNIRAD MBF, OMNIRAD OMBB, OMNIRAD TPO, OMNIRAD 410, OMNIRAD BL723, OMNIRAD BL724, OMNIRAD BL750, OMNIRAD BL751, OMNIRAD 1173, OMNIRAD 127, OMNIRAD 184, OMNIRAD 184FF, OMNIRAD 2022, OMNIRAD 2100, OMNIRAD 2959, OMNIRAD 369, OMNIRAD 369E, OMNIRAD 379, OMNIRAD 379EG, OMNIRAD 4265, OMNIRAD 754, OMNIRAD 819, OMNIRAD 819DW, OMNIRAD 907, OMNIRAD 907FF, OMNIRAD BP, OMNIRAD 127D, ESACURE 1001M, ESACURE ONE, ESACURE A198, ESACURE KIP 160, ESACURE KIP 150, ESACURE KIP100F, ESACURE KIP-LT, ESACURE KIP-IT, ESACURE KTO-46, ESACURE DP-250, ESACURE TZT, and ESACURE KT-55 (all manufactured and sold by IGM Resins B.V.).

The radical polymerization initiator (B) is blended preferably in an amount of 0.01 to 10 parts by mass, more preferably in an amount of 0.05 to 5 parts by mass, relative to 100 parts by mass of the polymer (A). Satisfactory curing is achieved when the blended amount is 0.01 part by mass or more, and large amount of outgas derived from the initiator will not be generated when the blended amount is 10 parts by mass or less.

Crosslinking Agent (C)

The resin composition of the present invention preferably further comprises crosslinking agent (C).

The crosslinking agent (C) is a component capable of forming a crosslinking structure in the polymer (A) upon heating. The resin composition further comprising the crosslinking agent (C) is capable of forming a tackifier layer with a crosslinking structure.

The crosslinking agent (C) is preferably a compound with a multifunctional carbon-carbon multiple bond, more preferably a multifunctional (meth)acrylate.

There is no particular limitation to the multifunctional (meth)acrylate as long as the compound has 2 or more and 10 or less (meth)acryloyl groups, preferably 2 or more and 6 or less (meth)acryloyl groups.

Specific examples of the multifunctional (meth)acrylates used as the crosslinking agent (C) include the following compounds: alkyl (meth)acrylates, hydroxyl group-containing alkyl acrylates, polyalkylene glycol acrylate, dioxane acrylate, tricyclodecanol acrylate, fluorene acrylate, alkoxylated bisphenol A acrylate, (alkoxylated) trimethylolpropane acrylate, alkoxylated serine acrylate, (caprolactone-modified) isocyanurate acrylate, pentaerythritol acrylate, alkoxylated pentaerythritolacrylate, (alkoxylated) pentaerythritol acrylate, (alkoxylated) ditrimethylolpropane acrylate, and (alkoxylated) dipentaerythritol acrylate.

Preferred examples of the multifunctional acrylate compounds include polyethylene glycol #400 diacrylate (NK ESTER A-400 (molecular weight: 508)), polyethylene glycol #600 diacrylate (NK ESTER A-600 (molecular weight: 742)), A-DOD-N, A-BPE-10, A-GLY-9E, A-9300, A-9300-1CL, and AD-TMP-L, each manufactured and sold by Shin-Nakamura Chemical Co., Ltd.

The crosslinking agent (C) is more preferably a bi- or multi-functional (meth)acrylate curing agent having 2 or more and 10 or less acrylate groups in a molecule. Specific examples of such compounds include glycerol propyl-added tri(meth)acrylate, ditrimethyrol tetra(meth)acrylate, and dipentaerythritol penta(meth)acrylate.

There is no particular limitation with respect to the carbon-carbon multiple bond content of the crosslinking agent (C), but multiple bond equivalent of the compound is preferably 60 g/mol or more and 1000 g/mol or less, more preferably 80 g/mol or more and 900 g/mol or less, still more preferably 100 g/mol or more and 700 g/mol or less, most preferably 200 g/mol or more and 400 g/mol or less.

The multiple bond equivalent may be obtained by the method explained above in connection with the polymer (A).

The crosslinking agent (C) is blended preferably in an amount of 0 part by mass or more and 20 parts by mass or less, more preferably 0.5 parts by mass or more and 5 parts by mass or less, relative to 100 parts by mass to the polymer (A). The Tackifier residues may be suppressed further when the content of the crosslinking agent (C) is in the above-mentioned range.

Other Components

The resin composition of the present invention may contain other arbitrary components in addition to the above-mentioned components. The arbitrary components include antioxidants, aging retardants, UV absorbers, photostabilizers, antifoaming agents, leveling agents, antistatic agents, surfactants, preservation stabilizers, thermal polymerization inhibitors, plasticizers, modifiers of wettability, adhesion-imparting agents, tackifiers, organic solvents and the like. These compounds may be added alone or in combination of 2 or more components.

Such arbitrary components may be added in amounts which do not adversely affect the effects of the present invention. For example, the components are blended in an amount of 0 parts by mass or more and 10 parts by mass or less, relative to the total weight of the tackifier being 100 parts by mass.

(Meth)Acrylate Tackifier

There is no particular limitation to the method for producing the (meth)acryl-type tackifier which forms the tackifier layer of the pellicle, and conventional methods for producing a tackifier may be employed. For example, the above-mentioned polymer (A), the radical polymerization initiator (B), optionally the crosslinking agent (C), an organic solvent and other components are blended in the above-mentioned amounts and mixed together to obtain a resin composition; and curing the thus obtained resin composition to thereby obtain a (meth)acryl-type tackifier.

There is no particular limitation with respect to the viscosity of the resin composition, but too high viscosity makes uniform application difficult. Accordingly, from the viewpoint of easy application of the resin composition during the preparation of the tackifier layer on the pellicle frame, the resin composition preferably has a high solution stability. In the present invention, a high solution stability is defined as no marked increase in viscosity 72 hours after the preparation of the resin composition, relative to the viscosity immediately after the preparation of the resin composition (initial viscosity). For example, amount of increase in viscosity at room temperature after 72 hours from the preparation of the resin composition, as compared to the initial viscosity immediately after the preparation thereof, is preferably less than 30%. A resin composition with low rate of viscosity increase during storage, that is, high solution stability, is preferred because such a resin composition stabilizes the amount of coating solution applied by dispenser coating and increases the yield rate of the coating step.

The viscosity (initial viscosity and viscosity after storage) of the resin composition may be measured by an E-type viscometer.

A (meth)acryl-type tackifier may be obtained by curing the resin composition of the present invention. Regarding the curing method and the like, reference should be made to step 2) of the method for producing the pellicle which is explained below.

2. Method for Producing a Pellicle

The pellicle of the present invention may be produced in the same manner as any conventional pellicle except that a tackifier layer made from the above-mentioned (meth)acryl type tackifier is provided. For example, a pellicle may be obtained by: 1) stretching a pellicle membrane over an end surface of one opening of a pellicle frame; and 2) providing a tackifier layer on an end surface of the opposite opening of the pellicle frame. This method may be performed by switching the order of steps 1) and 2).

Regarding Step 1)

A pellicle membrane is stretched over an end surface of one opening of a pellicle frame. The stretching of the pellicle membrane may be performed by a method generally used in the art. For example, an adhesive generally used in the art may be applied to an end surface of one opening of the pellicle frame, thereby forming an adhesive layer, and a pellicle membrane may be fixed on the thus formed adhesive layer.

The adhesive may be any conventional adhesive; examples include a cellulose derivative, a chlorinated polypropylene, a polyamide adhesive, a fluororesin adhesive, an acrylic adhesive, an epoxy resin, and a polyamide adhesive.

Regarding Step 2)

Next, a tackifier layer is provided on an end surface of an opening of the pellicle frame, which opening is an opening opposite to the opening having the pellicle membrane stretched thereover. For forming the tackifier layer, either the above-mentioned resin composition per se or a coating solution containing the resin composition is prepared and applied to the end surface of the opening of the pellicle frame, followed by drying and curing for forming a tackifier, thereby forming the tackifier layer.

The coating solution may contain an organic solvent together with the resin composition. Specific examples of the organic solvents include the following compounds:

Aromatic solvents, such as toluene and xylene; ketone solvents, such as acetone, methylethyl ketone, methylisobutyl ketone, and 2-methyl-5-hexanone; ester solvents, such as ethyl acetate and butyl acetate; halogen solvents, such as methyl chloride, dichloromethane, and dichloroethane; and Glycol ether solvents, such as ethyleneglycol monoethylether, propyleneglycol monomethylether, and propyleneglycol mono-n-propylether; and glycol ether carboxylate solvents, such propyleneglycol monomethylether acetate.

The organic solvents may be used alone or in a mixture of 2 or more solvents.

Boiling points of the organic solvents (that is, the boiling point of the solvent when a solvent is used alone, and the boiling point of a mixture when 2 or more solvents are used) is preferably 150° C. or less. Since thermal decomposition of the (meth)acryl polymer used as the polymer (A) initiates at around 150° C., when the boiling point of the organic solvent used is 150° C. or less, removal of the organic solvent becomes possible without heating to about 150° C. where the polymer (A) may start decomposing.

There is no particular limitation with respect to the amount of the organic solvent used, but in general, the amount of the organic solvent is preferably 0 part by mass or more and 90 parts by mass or less, more preferably 0 part by mass or more and 50 parts by mass or less, relative to the total mass (100 parts by mass) of the coating solution.

Application of the resin composition or coating solution may be performed by any coating method, such as a spraying coating method, a dip coating method, a brush coating method, a spatula coating method, a roller coating method, or a cast coating method. In the cast coating method, for example, a droplet of the resin composition or coating solution is applied on the surface of the pellicle frame and the droplet is coated thereon by spreading out the droplet into a uniform thickness using a tool.

The coated (meth)acrylic tackifier solution is dried and, then, cured by heating or light irradiation to thereby obtain a tackifier. The drying and curing may be performed simultaneously. The heating may be performed under the conditions in which temperature is 40° C. to 170° C. for 10 minutes to 2880 minutes. The light irradiation may be performed under the conditions in which wavelength is 254 nm to 365 nm for 10 minutes to 30 minutes.

There is no particular limitation with respect to the thickness of the thus obtained tackifier, but in general, it is 0.2 mm or more and 0.8 mm or less. Further, from the viewpoint of enabling uniform application to a mask, the thickness is preferably 0.1 mm or more.

The tackifier obtained in the above-mentioned manner is used as the tackifier layer. A protection film may be attached to the tackifier layer. A polyester film or polyethylene film subjected to a release treatment with silicone or fluorine may be used as the protection film.

In addition, the tackifier layer may be subjected to a flattening treatment. The flattening treatment may not only adjusts the thickness of the tackifier layer, but also improves the flatness of the tackifier layer. The pellicle may be flattened by, for example, sandwiching the pellicle between surface plates each having a high degree of flatness, or performing the curing and molding in 2 separate steps. When the molding is performed in 2 steps, the molding temperature of the second step is preferably set at a temperature which is higher than the molding temperature of the first step. The molding temperature may be appropriately selected based on the composition of the tackifier, but the molding temperature of the first step is preferably about 40° C. to 150° C., and the molding temperature of the second step is preferably about 60° C. to 200° C.

In addition, volatile components may be removed for suppressing the generation of outgas from the tackifier layer. For example, the volatile components may be removed by heating and drying the pellicle under the conditions in which the tackifier layer and pellicle membrane do not deteriorate, such as at 150° C. for 4 hours or at 120° C. for 20 hours.

3. Use of Pellicles

The thus obtained pellicle is mounted on a mask via tackifier layer. As a result, the pellicle may prevent the attachment of contaminants to the mask. The contaminants attached to the mask cause bad resolution to wafers when exposed light focuses on the contaminants and, therefore, the pellicle is mounted to cover the exposure area of the mask.

The mask is a glass substrate and the like with a patterned light shielding film disposed thereon. The light shielding film may be a metal film of Cr, MoSi and the like.

Finally, exposure light is made incident on the mask from portions exclusive of the light shielding film and permeates the pellicle membrane. In general, the exposure light is made incident on the pellicle membrane in parallel with a normal line thereof, but the exposure light may be made incident on the pellicle membrane obliquely to the normal line.

Exposure light used for lithography in, for example, a process of forming a circuit pattern to be drawn on a semiconductor element may be a short-wavelength excimer light, such as an i-line (wavelength: 365 nm) of a mercury lamp, a KrF excimer laser (wavelength: 248 nm), or an ArF excimer laser (wavelength: 193 nm).

As explained above, the tackifier layer is a (meth)acrylic tackifier which comprises the polymer (A) having a structural unit derived from a (meth)acrylate and a side chain consisting of a carbon-carbon multiple bond-containing group, and the radical polymerization initiator (B). Such a (meth)acrylic tackifier may exhibit excellent tackiness and excellent light resistance against excimer light and the like with short wavelength.

EXAMPLES

Hereinafter, the present invention will be described in detail with reference to Examples, which however shall not be construed as limiting the scope of the present invention.

1. Materials

The following materials were used in the Examples and Comparative Examples mentioned below.

1-1. Polymer (A)

RA-341: "ART CURE RA-341" manufactured and sold by Negami Chemical Industrial Co., Ltd. (multiple bond equivalent: 13000 g/mol, weight average molecular weight: 80000)

RA-331P: "ART CURE RA-331P" manufactured and sold by Negami Chemical Industrial Co., Ltd. (multiple bond equivalent: 7500 g/mol, weight average molecular weight: 100000)

DT-7: manufactured and sold by Negami Chemical Industrial Co., Ltd. (multiple bond equivalent: 1600 g/mol, weight average molecular weight: 200000)

SK-DYNE 1495: acrylate copolymer manufactured and sold by Soken Chemical & Engineering Co., Ltd. (multiple bond equivalent: 0 g/mol)

1-2. Radical Polymerization Initiator (B)

PERKADOX 12-XL25: peroxide type radical polymerization initiator (thermal radical polymerization initiator) manufactured and sold by KAYAKU AKZO CORPORATION Omnirad 1173: photopolymerization initiator manufactured and sold by IGM Resins B.V, 2-hydroxy-2-methyl-1-phenyl-propane-1-one

1-3. Crosslinking Agent (C)

A-600: "NK Ester A-600" manufactured and sold by SHIN-NAKAMURA CHEMICAL Co., Ltd. (number of acrylate groups: 2)

L-45: isocyanate type curing agent "L-45" manufactured and sold by Soken Chemical & Engineering Co., Ltd.

2. Preparation of Resin Composition

Example 1: Preparation of Resin Composition 1

Sixty five (65) parts by mass of toluene was added to 100 parts by mass of "ART CURE RA-341" (solid content concentration: 100%) (manufactured and sold by Negami Chemical Industrial Co., Ltd.) and agitated at room temperature to thereby prepare polymer (A) having a solid content concentration of 35%. To 100 parts by mass of the polymer (A) were added 1.0 part by mass of a crosslinking agent (C) ("NK Ester A-600" manufactured and sold by SHIN-NAKAMURA CHEMICAL Co., Ltd.; solid content concentration: 100%) and 0.22 parts by mass of a peroxide type radical polymerization initiator (B) ("PERKADOX 12-XL25" manufactured and sold by KAYAKU AKZO CORPORATION; solid content concentration: 25%), followed by agitation at room temperature, to thereby obtain resin composition 1 having solid content concentration ratio of RA-341:A-600:PERKADOX 12-XL25=100:2.86:0.16.

Example 2: Preparation of Resin Composition 2

Ten (10) parts by mass of toluene was added to 100 parts by mass of "ART CURE RA-331P" (solid content concentration: 45%) (manufactured and sold by Negami Chemical Industrial Co., Ltd.) and agitated at room temperature to thereby prepare polymer (A) having a solid content concentration of 35%. To 100 parts by mass of the polymer (A) were added 1.0 part by mass of a crosslinking agent (C) ("NK Ester A-600" manufactured and sold by SHIN-NAKAMURA CHEMICAL Co., Ltd.; solid content concentration: 100%) and 0.22 parts by mass of a peroxide type radical polymerization initiator (B) ("PERKADOX 12-XL25" manufactured and sold by KAYAKU AKZO CORPORATION; solid content concentration: 25%), followed by agitation at room temperature, to thereby obtain resin composition 2 having solid content concentration ratio of RA-331P:A-600:PERKADOX 12-XL25=100:2.86:0.16.

Example 3: Preparation of Resin Composition 3

Ten (10) parts by mass of toluene was added to 100 parts by mass of "ART CURE DT-7" (solid content concentration: 45%) (manufactured and sold by Negami Chemical Industrial Co., Ltd.) and agitated at room temperature to thereby prepare polymer (A) having a solid content concentration of 35%. To 100 parts by mass of the polymer (A) were added 1.0 part by mass of a crosslinking agent (C) ("NK Ester A-600" manufactured and sold by SHIN-NAKAMURA CHEMICAL Co., Ltd.; solid content concentration: 100%) and 0.22 parts by mass of a peroxide type radical polymerization initiator (B) ("PERKADOX 12-XL25" manufactured and sold by KAYAKU AKZO CORPORATION; solid content concentration: 25%), followed by agitation at room temperature, to thereby obtain resin composition 3 having solid content concentration ratio of DT-7:A-600:PERKADOX 12-XL25=100:2.86:0.16.

Example 4: Preparation of Resin Composition 4

A resin composition was prepared in the manner as Example 1 except for omitting the crosslinking agent (C), thereby obtaining resin composition 4.

Example 5: Preparation of Resin Composition 5

A resin composition was prepared in the manner as Example 4 except for changing the amount of the peroxide type radical polymerization initiator (B) to 2.7 parts by mass, thereby obtaining resin composition 5.

Example 6: Preparation of Resin Composition 6

Thirty two (32) parts by mass of toluene was added to 100 parts by mass of "ART CURE RA-341" (solid content concentration: 100%) (manufactured and sold by Negami Chemical Industrial Co., Ltd.) and agitated at room temperature to thereby prepare polymer (A) having a solid content concentration of 68%. To 100 parts by mass of the polymer (A) was added 2.7 parts by mass of a peroxide type radical polymerization initiator (B) ("PERKADOX 12-XL25" manufactured and sold by KAYAKU AKZO CORPORATION; solid content concentration: 25%), followed by agitation at room temperature, to thereby obtain resin composition 6 having solid content concentration ratio of RA-341:PERKADOX 12-XL25=100:1.

Example 7: Preparation of Resin Composition 7

To 100 parts by mass of "ART CURE RA-341" (solid content concentration: 100%) (manufactured and sold by Negami Chemical Industrial Co., Ltd.) was added 4 parts by mass of a peroxide type radical polymerization initiator (B) ("PERKADOX 12-XL25" manufactured and sold by KAYAKU AKZO CORPORATION; solid content concentration: 25%), followed by agitation at room temperature, to thereby obtain resin composition 7 having solid content concentration ratio of RA-341:PERKADOX 12-XL25=100:1.

Example 8: Preparation of Resin Composition 8

To 100 parts by mass of "ART CURE RA-341" (solid content concentration: 100%) (manufactured and sold by Negami Chemical Industrial Co., Ltd.) were added 4 parts by mass of a peroxide type radical polymerization initiator (B) ("PERKADOX 12-XL25" manufactured and sold by KAYAKU AKZO CORPORATION; solid content concentration: 25%) and 0.01 part by mass of a photoradical initiator ("Omnirad 1173" manufactured and sold by BASF), followed by agitation at room temperature, to thereby obtain resin composition 8 having solid content concentration ratio of RA-341:PERKADOX 12-XL25:Omnirad 1173=100:1:0.01.

Comparative Example 1: Preparation of Resin Composition 9

To 100 parts by mass of polymer (A) (Acrylic resin SK-DYNE 1495; solid content concentration: 35%) was added 0.09 parts by mass of L-45 (solid content concentration: 45%) as crosslinking agent (C), followed by agitation at room temperature, to thereby obtain resin composition 9 having solid content concentration ratio of SK-DYNE 1495:L-45=100:0.12.

Comparative Example 2: Preparation of Resin Composition 10

A resin composition was prepared in the manner as Example 1 except for omitting the peroxide type radical polymerization initiator (B) and using 0.09 parts by mass of L-45 (solid content concentration: 45%) as the crosslinking agent (C), thereby obtaining resin composition 10.

Comparative Example 3: Preparation of Resin Composition 11

To 100 parts by mass of polymer (A) (Acrylic resin SK-DYNE 1495; solid content concentration: 100%) was added 0.09 parts by mass of L-45 (solid content concentration: 45%) as crosslinking agent (C), followed by agitation at room temperature, to thereby obtain resin composition 11 having solid content concentration ratio of SK-DYNE 1495:L-45=100:0.04.

3. Preparation of Pellicles

Figure 1:
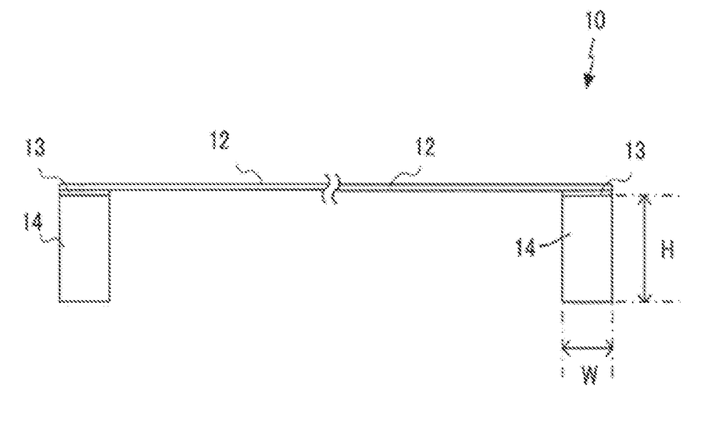
FIG. 1 is a schematic sectional view of a pellicle produced in the Examples.

Pellicles as shown in FIG. 1 below were prepared using each of the above-described resin compositions 1 to 11.

Pellicle frame 14 (outer size: 149 mm×122 mm, frame height H: 5.8 mm, frame width W: 2 mm) made of anodized aluminum was provided. The resin composition was applied to one end face of the pellicle frame 14 using a dispenser. The applied solution was dried under heating (at 60° C. for 30 minutes). A separator was disposed on the thus prepared layer and pressed on a flat surface, followed by molding under heating (at 120° C. for 30 minutes), thereby obtaining a tackifier layer. Pellicle film 12 was bonded onto the other end face of the pellicle frame 14 via film adhesive 13, thereby obtaining pellicle 10.

In Example 8, after drying and heating the resin composition, the resultant layer was subjected to a photocuring treatment while adjusting the dose of radiation to 410 mJ/cm$^2$.

4. Evaluation 4-1. Solution Stability

Solution stability of each of the above-prepared resin composition was evaluated as follows.

Immediately after the preparation of the resin composition, initial viscosity was measured using an L-type viscometer (TV-22L, manufactured and sold and sold by Toki Sangyo Co., Ltd.).

Next, the resin composition was stored at 25° C. for 5 hours. With respect to the stored resin composition, viscosity was measured using the L-type viscometer in the same manner as the initial viscosity, there by obtaining a viscosity after storage. Rate of viscosity change (%) after storage was calculated based on the following equation.

Rate of viscosity change (%)=[(Viscosity after storage−Initial viscosity)/Initial viscosity]×100

Based on the rate of viscosity change (%), storage stability was evaluated in accordance with the following criteria.
A: Rate of viscosity change is less than 10%
F: Rate of viscosity change is 10% of more

4-2. Tackifier Residues

The pellicles prepared in Examples and Comparative Examples having a tackifier layer were used individually. Protection film was removed from a pellicle. Using a simple mounter, the pellicle was attached to a quartz substrate under load (10 kg, 30 seconds), to thereby obtain a substrate with a pellicle attached thereto. The obtained substrate with a pellicle attached thereto was placed under room temperature (20±3° C.) for 24 hours and, then fixed horizontally, followed by irradiation of 5-mm square ArF light with a wavelength of 193 nm (energy density: 15 J/cm², frequency: 10 Hz). Next, the pellicle was peeled off from the substrate by pulling up the long side of the pellicle using a tension tester. Surface of each adherent (quartz substrate) was observed and tackifier residues were evaluated in accordance with the following criteria.

A: Area of the tackifier residue is 0% or more and 20% or less, relative to the total area of the attachment.

F: Area of the tackifier residue is more than 20% and 100% or less, relative to the total area of the attachment.

4-3. Outgas

Ten (10) milligrams of a tackifier was removed from the pellicle with the tackifier and 10 mg of the thus removed tackifier was placed in a glass insert with a cap having two ports, followed by setting the resultant glass insert in a thermal desorption apparatus (TDTS-2020, manufactured and sold by Agilent Technologies, Ltd.). While introducing H₂ gas as a carrier gas from one of the ports, heating was performed at 100° C. for 30 minutes to extract volatile components, and the volatile components were then condensed by a cold trap at −20° C. Subsequently, the cold trap was reheated to 280° C. at 10° C./min. An amount of gas generated (in terms of decane) was determined from the extracted, condensed volatile components by a gas chromatograph (GC) and mass spectrometer and used as the amount of generated outgas. The measurement conditions for GC-MS are as follows.

Apparatus: QP2010plus

Column: DB-1 (inner diameter: 0.32 mm, length: 60.0 m, thickness: 1.00 μm)

Scan range: 35 to 450 m/z

Ionization: 0.78 kV

Method of measurement: Amount of gas generated at 100° C., 30 minutes were calculated in terms of decane Based on the calculated amount of the generated gas, outgas was evaluated in accordance with the following criteria.

A: Total amount of outgas generated from a whole tackifier layer of one pellicle is 10 ppm or less F: Total amount of outgas generated from a whole tackifier layer of one pellicle is more than 10 ppm Results of evaluation are summarized in the following Table 1, together with the composition of the resin composition used.

In Table 1, "nv" represents solid content concentration.

TABLE 1

| Components | | Example 1 Resin Composition 1 | Example 2 Resin Composition 2 | Example 3 Resin Composition 3 | Example 4 Resin Composition 4 | Example 5 Resin Composition 5 | Example 6 Resin Composition 6 | Example 7 Resin Composition 7 | Example 8 Resin Composition 8 | Comp. Example 1 Resin Composition 9 | Comp. Example 2 Resin Composition 10 | Comp. Example 3 Resin Composition 11 |
|---|---|---|---|---|---|---|---|---|---|---|---|---|
| Polymer (A) | RA-341 (nv = 35%) | 100 | | | 100 | 100 | | | | | 100 | |
| | RA-341 (nv = 68%) | | | | | | 100 | | | | | |
| | RA-341 (nv = 100%) | | | | | | | 100 | 100 | | | |
| | RA-331P (nv = 35%) | | 100 | | | | | | | | | |
| | DT-7 (nv = 35%) | | | 100 | | | | | | | | |
| | SK Dine 1495 (nv = 35%) | | | | | | | | | 100 | | |
| | SK Dine 1495 (nv = 100%) | | | | | | | | | | | 100 |
| Radical polymerization initiator (B) | Perkadox 12-XL25 | 0.16 | 0.16 | 0.16 | 0.16 | 1 | 1 | 1 | 1 | | | |
| | Omnirad1173 | | | | | | | | | 0.01 | | |
| Crosslinking agent (C) | A-600 | 2.86 | 2.86 | 2.86 | | | | | | | | |
| | L-45 | | | | | | | | | 0.12 | 0.12 | 0.04 |
| Evaluations | Solution stability (Rate of viscosity change) | A (+4%) | A (−5%) | A (+1%) | A (−5%) | A (−4%) | A (−4%) | A (7%) | A (−8.6%) | F (+72%) | F (+10%) | Solution not formed; Unable to evaluate |
| | Tackifier residues | A | A | A | A | A | A | A | A | A | A | |
| | Outgas | A | A | A | A | A | A | A | A | A | A | |

The resin compositions of Examples 1 to 8 each containing the polymer (A) having a structural unit derived from a (meth)acrylate and a side chain consisting of a carbon-carbon multiple bond-containing group and the radical polymerization initiator (B) showed excellent solution stability with the rate of viscosity change of less than 10% after 5 hours of storage.

On the other hand, the rate of viscosity change after 5 hours of storage was 10% or more for the resin compositions of Comparative Examples 1 to 3 which do not contain the radical polymerization initiator (B). Especially the tackifier solution of Comparative Example 1 had an initial viscosity of 2597 mPa·S, a viscosity after 5 hour storage of 4469 mPa·S which is a determination limit of the measurement apparatus, and increase in viscosity was 72%. The increase in viscosity was largely exceeding 10% and therefore, solution stability was low.

This application is entitled to and claims the priority of Japanese Patent Application No. 2019-064910 filed on Mar. 28, 2019, the disclosure of which including the specification, drawings and abstract is herein incorporated by reference in its entirety.

INDUSTRIAL APPLICABILITY

The present invention may provide a tackifier solution having high solution stability by the use of the resin composition used in the present invention.

REFERENCE SIGNS LIST 10 pellicle
12 pellicle membrane
13 tackifier layer
14 pellicle frame

The invention claimed is:

1. A pellicle comprising:
a pellicle frame;
a pellicle membrane stretched over an end surface of one opening of the pellicle frame; and
a tackifier layer provided on an end surface of other opening of the pellicle frame,
wherein the tackifier layer contains a (meth)acrylic tackifier which is a solidified resin composition comprising a polymer (A) and a radical polymerization initiator (B), the polymer (A) having a structural unit derived from a (meth)acrylate and a side chain consisting of a carbon-carbon multiple bond-containing group,
wherein the tackifier layer does not contain a photoradical initiator,
wherein the radical polymerization initiator (B) is a peroxide radical polymerization initiator or an azotype radical polymerization initiator,
wherein the peroxide radical polymerization initiator and the azotype radical polymerization initiator are thermal radical polymerization initiators and are not photoradical initiators, and
wherein an amount of the radical polymerization initiator (B) is 0.01 to 10 parts by mass, relative to 100 parts by mass of the polymer (A).

2. The pellicle according to claim 1, wherein a multiple bond equivalent of the polymer (A) is 156 g/mol or more and 100,000 g/mol or less.

3. The pellicle according to claim 1, wherein the carbon-carbon multiple bond-containing group is a carbon-carbon double bond-containing group.

4. The pellicle according to claim 1, wherein a weight average molecular weight of the polymer (A) is 10,000 or more and 1,000,000 or less.

5. The pellicle according to claim 1, wherein the resin composition further comprises a crosslinking agent (C).

6. The pellicle according to claim 5, wherein the crosslinking agent (C) is a compound having a multifunctional carbon-carbon multiple bond.

* * * * *